(12) United States Patent
Kim (10) Patent No.: US 7,919,375 B2
(45) Date of Patent: Apr. 5, 2011

(54) SEMICONDUCTOR DEVICE AND METHOD FOR MANUFACTURING THE DEVICE

(75) Inventor: Dae-Kyeun Kim, Yongin-si (KR)

(73) Assignee: Dongbu HiTek Co., Ltd., Seoul (KR)

(*) Notice: Subject to any disclaimer, the term of this patent is extended or adjusted under 35 U.S.C. 154(b) by 324 days.

(21) Appl. No.: 12/211,123

(22) Filed: Sep. 16, 2008

(65) Prior Publication Data

US 2009/0160010 A1 Jun. 25, 2009

(30) Foreign Application Priority Data

Dec. 24, 2007 (KR) .................. 10-2007-0136172

(51) Int. Cl.
*H01L 21/336* (2006.01)
(52) U.S. Cl. ................. 438/272; 257/E21.444
(58) Field of Classification Search .......... 438/272; 257/E21.444
See application file for complete search history.

(56) References Cited

U.S. PATENT DOCUMENTS

| 5,994,736 | A  | * | 11/1999 | Sugawara et al. ........... 257/330 |
| 6,806,534 | B2 | * | 10/2004 | Dokumaci et al. ........... 257/330 |
| 6,864,540 | B1 | * | 3/2005  | Divakaruni et al. ......... 257/368 |
| 7,071,043 | B2 | * | 7/2006  | Tang et al. .................. 438/197 |
| 2004/0157421 | A1 | * | 8/2004 | Koh .............................. 438/585 |
| 2005/0133836 | A1 |   | 6/2005 | Seo |

FOREIGN PATENT DOCUMENTS

| EP | 1 528 599       | 5/2005 |
| KR | 10-2001-0027096 | 4/2001 |
| KR | 10-2004-0070656 | 8/2004 |

* cited by examiner

*Primary Examiner* — Matthew C Landau
*Assistant Examiner* — Sun M Kim
(74) *Attorney, Agent, or Firm* — Sherr & Vaughn, PLLC (57) ABSTRACT

A semiconductor device and a method for manufacturing the device capable of preventing an LDD region and a lower portion of the gate electrode from overlapping each other to achieve desirable device performance are disclosed. Embodiments relate to a semiconductor device and a method for manufacturing the device that may minimize overlap between an LDD region and a lower portion of the gate electrode. Minimizing overlap may maximize device performance and minimize the generation of defects between gate electrodes.

14 Claims, 7 Drawing Sheets

SEMICONDUCTOR DEVICE AND METHOD FOR MANUFACTURING THE DEVICE

The present application claims priority under 35 U.S.C. 119 to Korean Patent Application No. 10-2007-0136172 (filed on Dec. 24, 2007) which is hereby incorporated by reference in its entirety.

BACKGROUND

Embodiments relate to a semiconductor device and a method of manufacturing a device that may maximize the reliability of the device. It may be desirable to minimize the size of a transistor allowing the number of transistors on a given area to be maximized. However, when minimizing the size of a transistor there is a limit in reducing the junction depth of the source/drain.

When manufacturing a semiconductor device, as a channel is changed from a relatively long channel to a short channel of 0.5 μm or less, a depletion region of the source/drain may penetrate the channel. This may minimize the effective channel length and threshold voltage, thereby causing a short channel effect. This short channel effect may result in a loss of gate control function in a MOS transistor.

It may be desirable to minimize the thickness of the gate insulating film or to minimize the width of the depletion region below the channel between the source/drain (e.g., a gate electrode) to minimize the short channel effect. It may also be desirable to decrease an impurity density in a semiconductor substrate and also to form a shallow junction to minimize the short channel effect.

A semiconductor device including a MOS transistor having a shallow junction is an example of a light doped drain (LDD) structure. Example FIGS. 1A to 1E are cross-sectional views illustrating a method for manufacturing a semiconductor device.

Figure 1A:
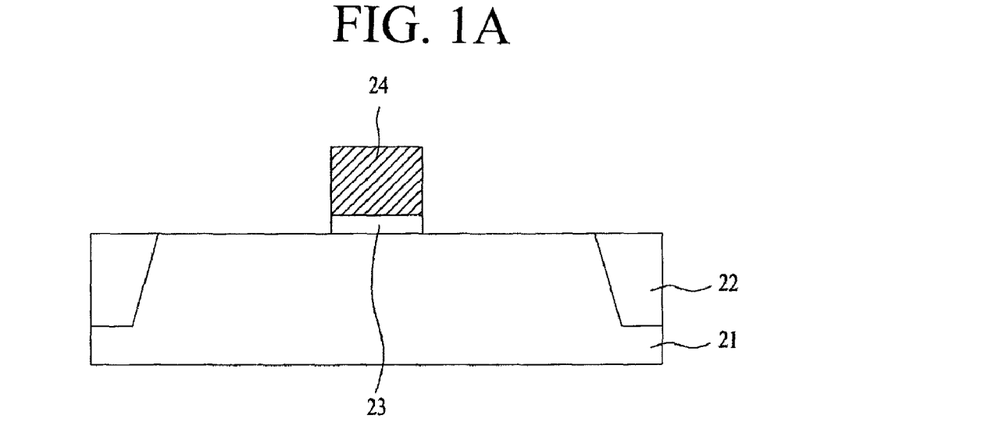
FIGS. 1A to 1E are cross-sectional views illustrating a method of manufacturing a semiconductor device.

As illustrated in example FIG. 1A, an active region and a device isolation region may be defined in semiconductor substrate 21. Device isolation film 22 may formed in the device isolation region of semiconductor substrate 21 through a LOCOS or shallow trench isolation (STI) process. After semiconductor substrate 21 is thermally oxidized at a relatively high temperature, gate insulating film 23 is deposited on and/or over semiconductor substrate 21. Then, a polysilicon layer may be deposited on and/or over the semiconductor substrate 21. Then the polysilicon layer and gate insulating film 23 may be selectively etched through a photolithography process, thereby forming gate electrode 24.

Figure 1B:
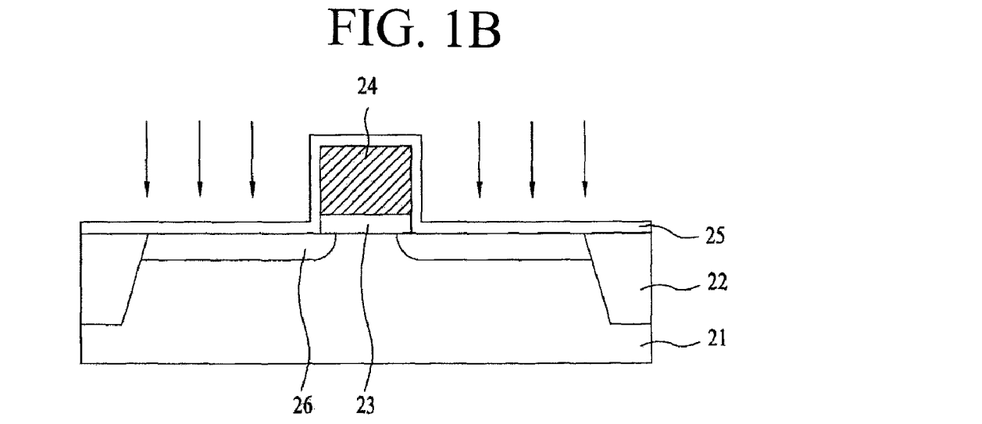

As illustrated in example FIG. 1B, oxide film 25 may be formed on and/or over the surface of semiconductor substrate 21 including gate electrode 24. Low-density impurity ions may then be injected into the surface of semiconductor substrate 21 using gate electrode 24 as a mask. Injecting impurity ions may form lightly doped drain (LDD) region 26 in the surface of semiconductor substrate 21 at the opposite sides of gate electrode 24. A low dose implant process may be used in the ion injection process.

Figure 1C:
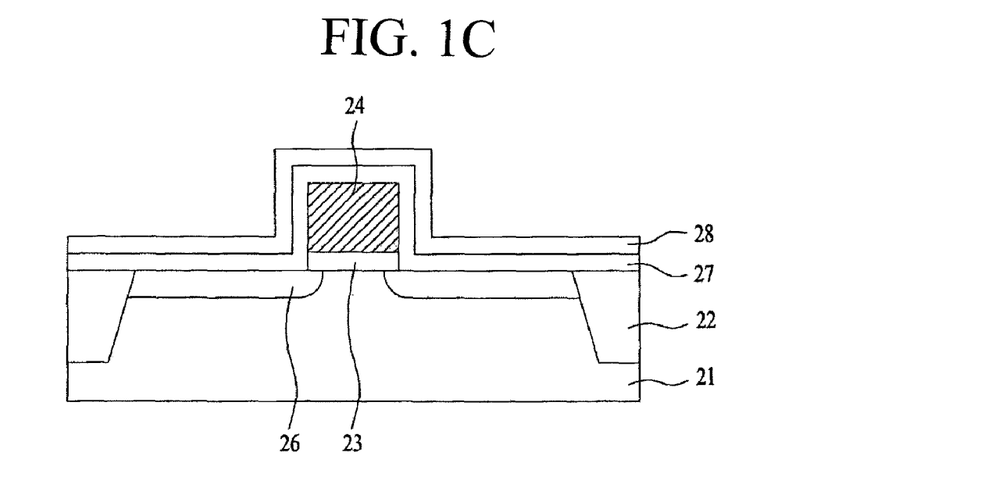

As illustrate in example FIG. 1C, after oxide film 25 is removed, first insulating film 27 may be formed on and/or over the surface of semiconductor substrate 21 including gate electrode 24. Insulating film 28, having a different etching selectivity, may then be formed on and/or over semiconductor substrate 21. In embodiments, first insulating film 27 may be formed of a silicon oxide film and second insulating film 28 may be formed of a silicon nitride film. When oxide film 25 is removed it may influence the quality of gate insulating film 23 and maximize a divot depth of device isolation film 22. This, in turn, may influence the device performance.

Figure 1D:
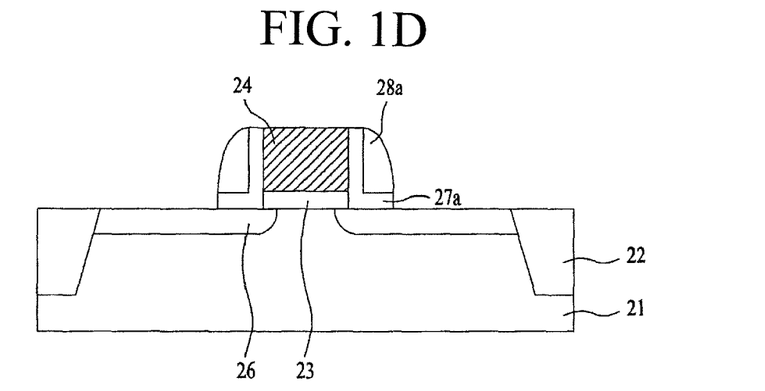

As illustrated in example FIG. 1D, an etch back process may then be performed on the entire surfaces of first insulating film 27 and second insulating film 28. First insulating film sidewall 27a and second insulating film sidewall 28a may thus, be formed at the opposite side surfaces of gate electrode 24.

Figure 1E:
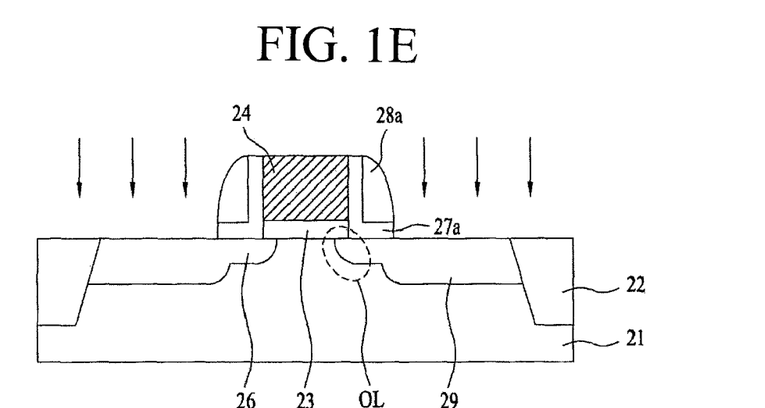

As illustrated in example FIG. 1E, high-density impurity ions may then be injected into the entire surface of semiconductor substrate 21 using gate electrode 24, first insulating film sidewall 27a and second insulating sidewall 28a as masks, thereby forming source/drain impurity region 29 in the surface of semiconductor substrate 21. Source/drain impurity region 29 may be formed connected to LDD region 26. In embodiments, a high dose implant process may be used in the ion injection process. An interlayer insulating film and metal lines may then be formed through a general process, thereby completing a logic process.

In such a semiconductor manufacturing method, however, the LDD region may be formed through the low dose implant process after the gate electrode is formed and through the high dose implant process after the spacer is formed. This may result in the LDD region overlapping with a lower portion of the gate insulating film as in a region OL as illustrated in example FIG. 1E. Accordingly, the overlapping LDD region and gate insulating film may deteriorate gate-induced drain leakage (GIDL) characteristics and generate a parasitic resistance that may minimize device performance.

Further, when using a spacer to create an isolation structure between the gate and active regions, there may be limitations to applying a gap-fill process to a dielectric layer between neighboring gate electrodes. Accordingly, as illustrated in example FIG. 2, defects such as a void may occur due to relatively small process variation.

Figure 2:
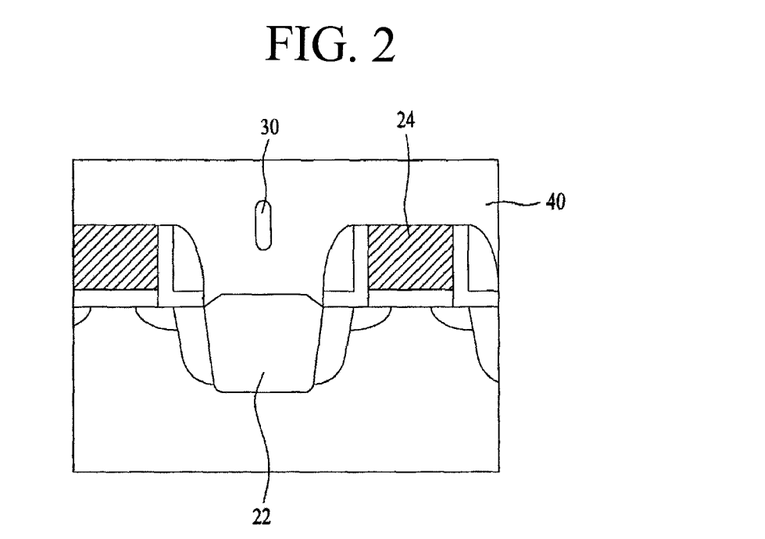
FIG. 2 illustrates a semiconductor device.

As illustrated in example FIG. 2, void 30 may be formed in dielectric layer 40 between neighboring gate electrodes 24a and 24b. A W-bridge may occur between filled metal patterns due to the void.

SUMMARY

Embodiments relate to a semiconductor device and a method for manufacturing the device that minimizes overlap between an LDD region and a lower portion of the gate electrode. Minimizing overlap may maximize device performance and minimize the generation of defects between gate electrodes.

Embodiments relate to a method for manufacturing a semiconductor device that may include at least one of the following steps: forming a device isolation film in an STI region of a lower structure and a sacrificial layer in a gate region of the lower structure; and then forming a lightly doped drain (LDD) region between the device isolation film and the sacrificial layer while using the device isolation film and the sacrificial layer as a barrier; and then selectively removing the sacrificial layer formed in the gate region to form a trench in the gate region; and then forming a spacer on and/or over sidewalls of the trench in the gate region; and then forming a gate insulating film on and/or over lowermost surface of the trench in the gate region; and then forming a gate electrode on and/or over the gate insulating film; and then forming a junction region on and/or over an upper portion of the LDD region; and then diffusing the LDD region to opposite ends of the lower portion of the gate region.

In accordance with embodiments, the gate electrode forming step may include at least one of the following steps: filling a conductive material layer in the gate region; and then injecting ions into the conductive material layer at a first dosage in a first direction inclined at a first inclination angle with respect to a normal direction of the uppermost surface of the lower structure; and then injecting ions into the conductive material layer at a second dosage in a second direction opposite to the first direction and inclined at a second inclination angle with respect to the normal direction of the uppermost surface of the lower structure; and then injecting ions into the conductive material layer at a third dosage at an angle which is perpendicular with respect to uppermost surface of the lower structure. In accordance with embodiments, the third dosage may be relatively larger than the first dosage and the second dosage, and the first inclination angle and the second inclination angle have a range from approximately 0° to 45°.

Embodiments relate to a semiconductor device that may include at least one of the following: a lower structure in which an STI region and a gate region are defined; a device isolation film formed in the STI region; a trench formed in the gate region; a sidewall spacer formed on and/or over sidewalls of the trench in the gate region having a height difference with the STI region; a gate insulating film formed on and/or over a lowermost surface of the trench in the gate region; a gate electrode formed on and/or over the gate insulating film having an uppermost surface that is coplanar with the uppermost surface of the device isolation film; a junction region formed in the lower structure between the device isolation film and the gate electrode; and an LDD region formed in the lower structure below the junction region.

Embodiments relate to a method that may include at least one of the following steps: forming a shallow trench isolation film in a substrate; and then forming a lightly doped drain region in the substrate adjacent to the shallow trench isolation film; and then forming a trench in a gate region of the substrate; and then simultaneously forming a junction region in the substrate and over the lightly doped drain region and a gate electrode by forming a gate electrode material layer in the trench and then sequentially performing on the gate electrode material layer a first ion implantation process at a first inclination direction and a first inclination angle with respect to a normal direction of the gate electrode material layer, a second ion implantation process at a second inclination direction opposite to the first inclination direction and a second inclination angle with respect to the gate electrode material layer, and a third ion implantation process at a third inclination angle with respect to a normal direction of the gate electrode material layer.

DRAWINGS

Example

Example

Example

Example

Example

Example

DESCRIPTION

Hereinafter, a semiconductor device and a method for manufacturing the device according to embodiments will be described in detail. Example FIGS. 3A to 3H illustrate cross-sectional view of a method of manufacturing a semiconductor device, in accordance with embodiments.

Figure 3A:
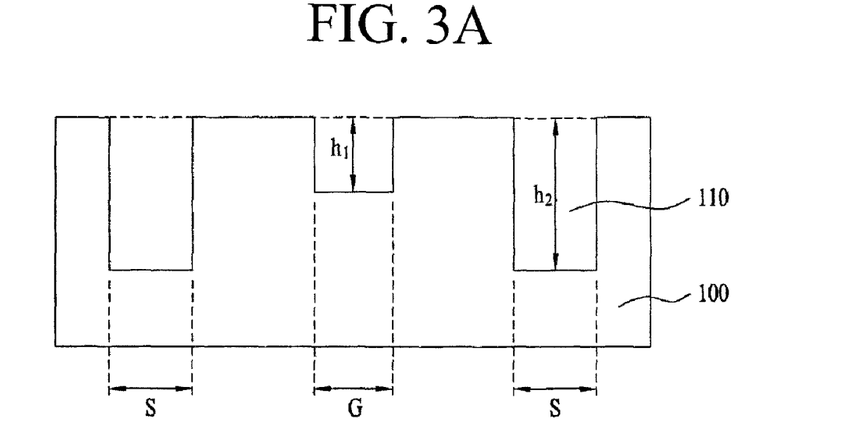
FIGS. 3A to 3H are cross-sectional views illustrating a method of manufacturing a semiconductor device in accordance with embodiments.

As illustrated in example FIG. 3A, STI region S for forming a device isolation film and gate region G for forming a gate electrode are defined in lower structure 100. Lower structure 100 may be, for example, a silicon substrate or a silicon layer formed on and/or over an insulating film. In the following description, a substrate is lower structure 100. STI region S and gate region G may be formed by selectively removing lower structure 100. In embodiments, depth h2 of STI region S may be larger than depth h1 of gate region G. STI region S and gate region G may be formed at the same time through a single process. Such a process may include forming a photoresist on and/or over lower structure 100. Then, the photoresist may be exposed to light with a half tone mask having both a light transmission region and a semi-transmission region or a slit mask using light diffraction. Accordingly, STI region S and gate region G having different depths may be formed at the same time through a single process.

Figure 3B:
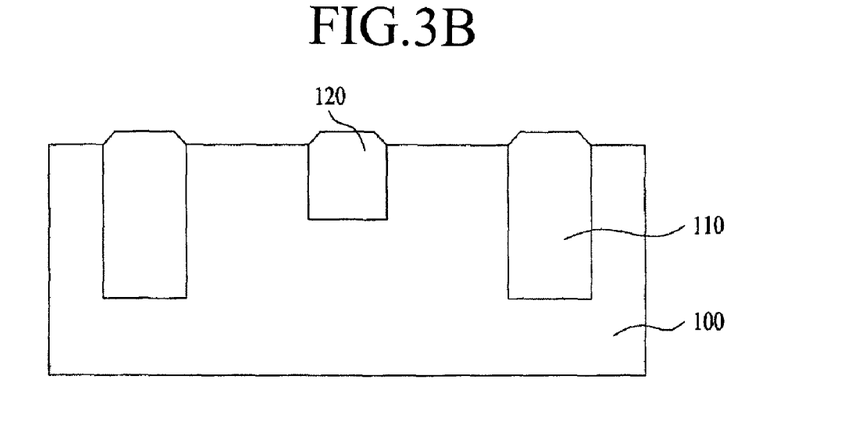

As illustrated in example FIG. 3B, device isolation film 110 made of an insulating film may then be formed in STI region S and sacrificial layer 120 made of an insulating film may also be formed in gate region G. For example, in embodiments an insulating film may be deposited on and/or over the entire surface of lower structure 100 to be filled in STI region S and gate region G. A chemical mechanical polishing (CMP) process may then be performed using lower structure 100 as a stop layer, thereby simultaneously forming device isolation film 110 and sacrificial layer 120.

Figure 3C:
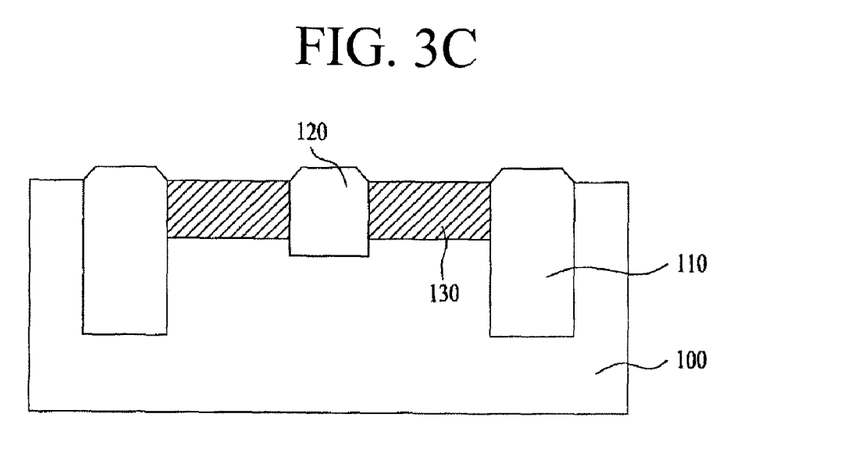

As illustrated in example FIG. 3C, while device isolation film 110 and sacrificial layer 120 are used as a barrier, low-density impurity ions may then be injected in lower structure 100 in regions between device isolation film 110 and gate electrode, thereby forming lightly doped drain (LDD) region 130. In embodiments, a low dose implant process may be used in the ion injection process. An additional mask may be formed using a photoresist, for example, in the ion injection process.

Figure 3D:
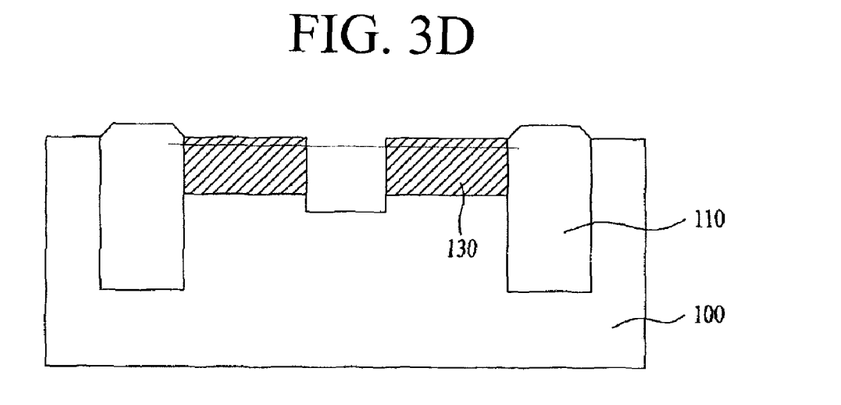

As illustrated in example FIG. 3D, sacrificial layer 120 may then be selectively removed to form a trench in lower structure 100. For example, in embodiments a photoresist pattern may be selectively formed to expose only gate region G, thereby selectively etching sacrificial layer 120.

Figure 3E:
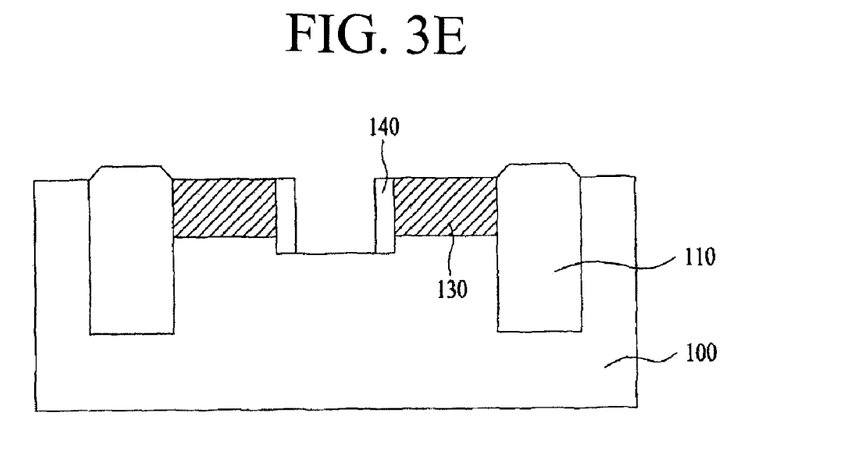

As illustrated in example FIG. 3E, sidewall spacer 140 may be formed on and/or over sidewalls of the trench. Sidewall spacer 140 may be formed by forming depositing a silicon nitride film on and/or over the entire surface of lower structure 100 and then selectively removing the silicon nitride film by an anisotropic etching process.

Figure 3F:
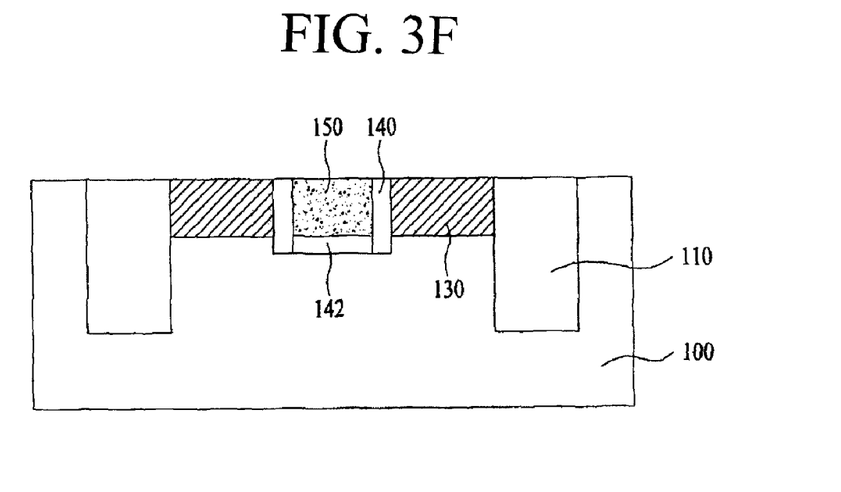

As illustrated in example FIG. 3F, gate insulating film 142 may be formed on and/or over a lowermost surface of the trench in gate region G and between sidewall spacer 140. Gate electrode material layer 150 may then be formed on and/or over gate insulating film 142. Gate electrode material layer 150 may be formed by filling a conductive material in the trench and on and/or over gate insulating layer 142. For example, in embodiments, gate electrode material layer 150 may be formed of metal or polysilicon. The conductive material may be deposited on and/or over gate insulating film 142 to be filled in gate region G. A CMP process may then be performed using sidewall spacer 140 as a stop layer, thereby forming gate electrode material layer 150.

Figure 3G:
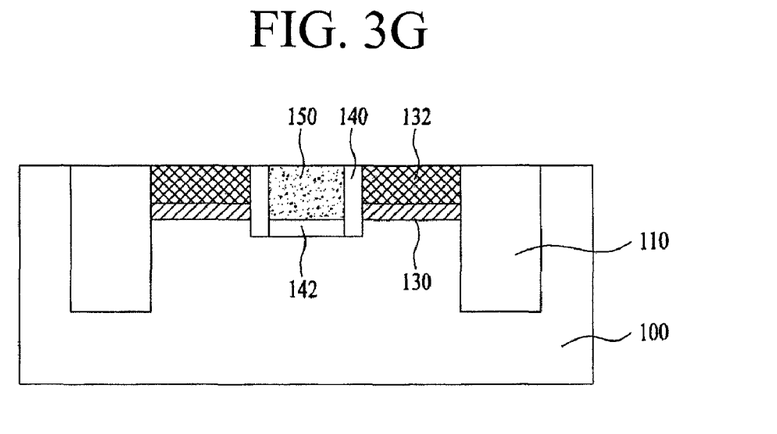

As illustrated in example FIG. 3G, high-density impurity ions may then be injected in an upper portion of LDD region 130, thereby forming junction region 132. The high impurity ions have a relatively higher density than the density of ions in the step of forming LDD region 130. In embodiments, a high dosage implant process may be used in the ion injection process. In the high dosage implant process ions are injected with higher energy compared to the low dosage implant process for forming LDD region 130. LDD region 130 may be disposed below junction region 132.

Figure 3H:
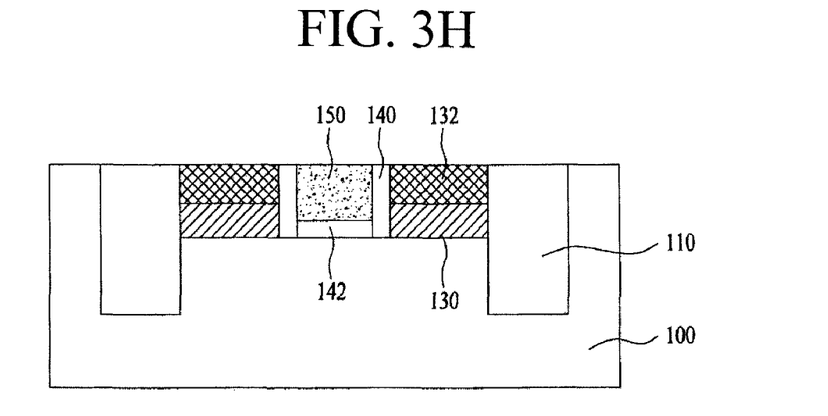

As illustrated in example FIG. 3H, LDD region 130 may be diffused to the opposite sides (e.g., left and right ends) of a lower portion of gate region G. In embodiments, LDD region 130 may be diffused by an annealing process. A salicide process, back-end-of-line (BEOL) process, or M1C process may then be performed.

In the method for manufacturing a semiconductor device in accordance with embodiments, the gate region and the STI region may be formed at the same time. Sacrificial layer 120 may be formed in the gate region of the same material as device isolation film 110. While sacrificial layer 120 and device isolation film 110 are used as a barrier, ions may be injected to form LDD region 130. Accordingly, embodiments can prevent overlapping of a lower portion of the gate electrode and LDD region 130.

A method for manufacturing a semiconductor device in accordance with embodiments will next be described with reference to the accompanying drawings. Example FIGS. 4A to 4D are cross-sectional views illustrating a method for manufacturing a semiconductor device in accordance with embodiments.

In the method for manufacturing a semiconductor device according to embodiments, gate electrode material layer 150 may be formed of a conductive material such as polysilicon, allowing ion injection. Example FIGS. 4A to 4C illustrate steps where gate electrode material layer 150 is formed as a polysilicon layer.

Figure 4A:
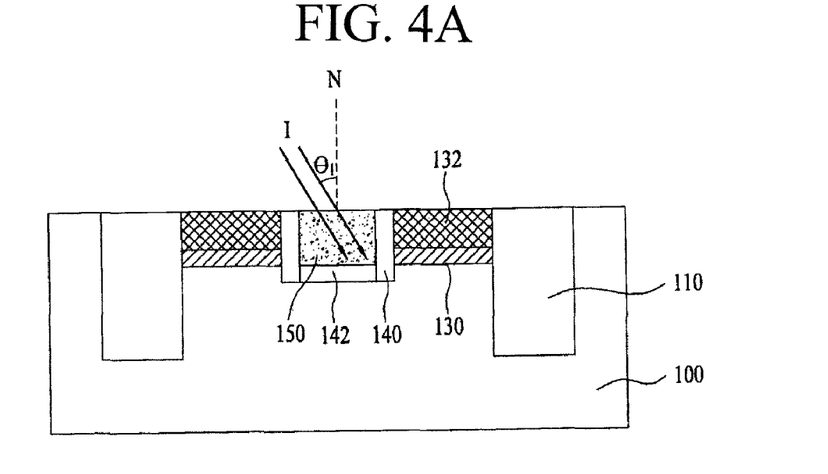
FIGS. 4A to 4D are cross-sectional views illustrating a method for manufacturing a semiconductor device in accordance with embodiments.

As illustrated in example FIG. 4A, ions are first injected in a first direction I inclined by a first inclination angle $\theta_1$ with respect to a normal direction N of one of substrate 100 and the uppermost surface of gate electrode material layer 150.

Figure 4B:
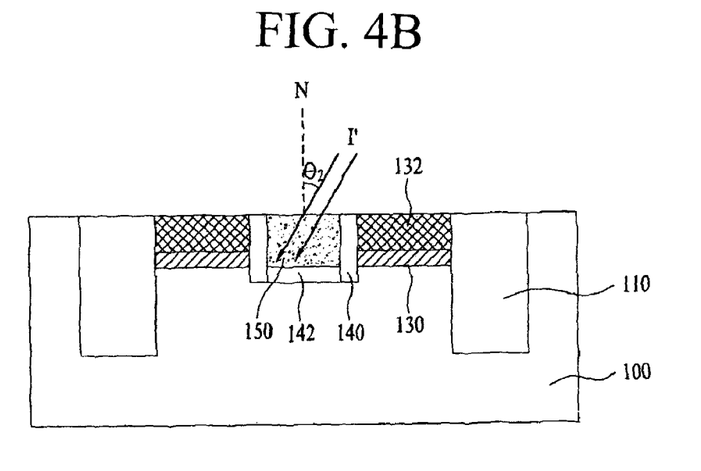

As illustrated in example FIG. 4B, ions may then be injected in a second direction I' inclined by a second inclination angle $\theta_2$ with respect to one of the normal direction N of substrate 100 and the uppermost surface of gate electrode material layer 150. Direction I is an opposite direction to direction I' relative to the normal direction N of substrate 100.

Figure 4C:
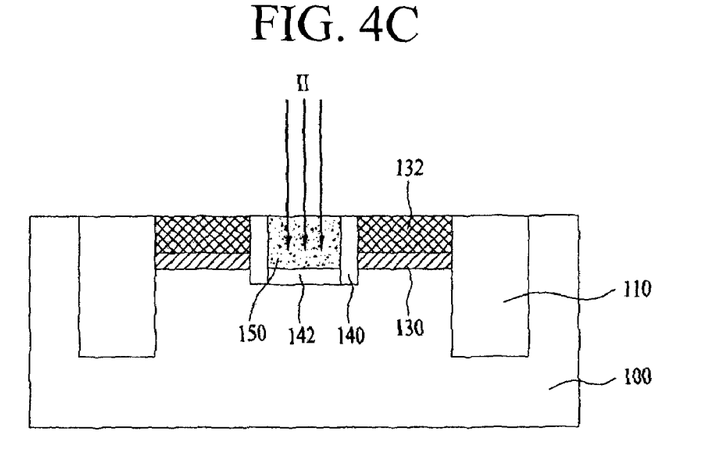

As illustrated in example FIG. 4C, ions may then be injected into gate electrode material layer 150 in direction II, which is substantially perpendicular with respect to the uppermost surface of substrate 100. In embodiments, when ions are injected in a direction inclined with respect to the vertical direction of substrate 100 the dosage may be relatively smaller than a dosage when ions are injected substantially perpendicular with respect to the uppermost surface of substrate 100. The impurity ions may employ elements of the third group on the periodic table including phosphorus (P) as n-type impurity ions, and may employ elements of the fifth group on the periodic table including boron (B) as p-type impurity ions. The first inclination angle, $\theta_1$ and the second inclination angle $\theta_2$ may have a range from approximately 0° to 45°. When ions are injected into gate electrode material layer 150 (i.e., the polysilicon layer) through the above-described process, the ions may be also injected into the upper portion of LDD region 130 forming junction region 132 and gate electrode 152 at the same time.

Figure 4D:
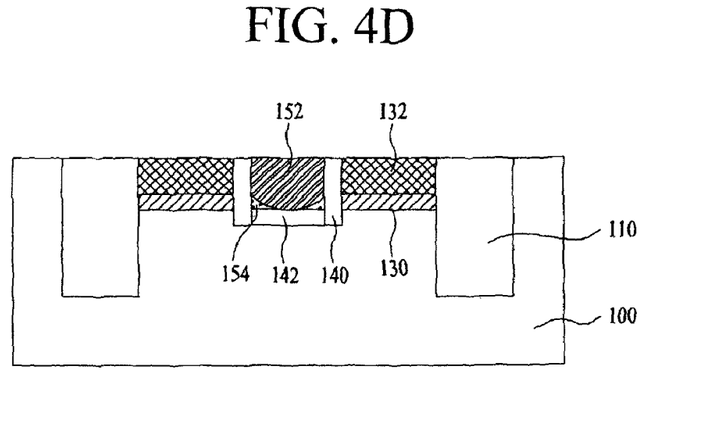

As illustrated in example FIG. 4D, due to the above-described ion implantation process, a gate electrode having first region 154 and second region 152 may be formed. In embodiments, first region 154 has a first impurity ion density and is formed at opposite ends of the lowermost portion of the gate electrode. Second region 152 has a second density larger than the first density and may be formed in a remaining region except first region 154. The gate electrode having two regions 152 and 154 with different density distributions may be formed by adjusting an ion injection dosage and an ion injection angle. Particularly, the impurity ion density of the opposite ends of the lower portion of the gate electrode is set to be smaller than the impurity ion density of the remaining region. The field is reduced at the end of the lowermost portion of the gate electrode by setting a smaller impurity ion density at the opposite ends of the lowermost portion of the gate electrode. This may provide an effect of maximizing gate-induced drain leakage (GIDL) characteristics.

Figure 5:
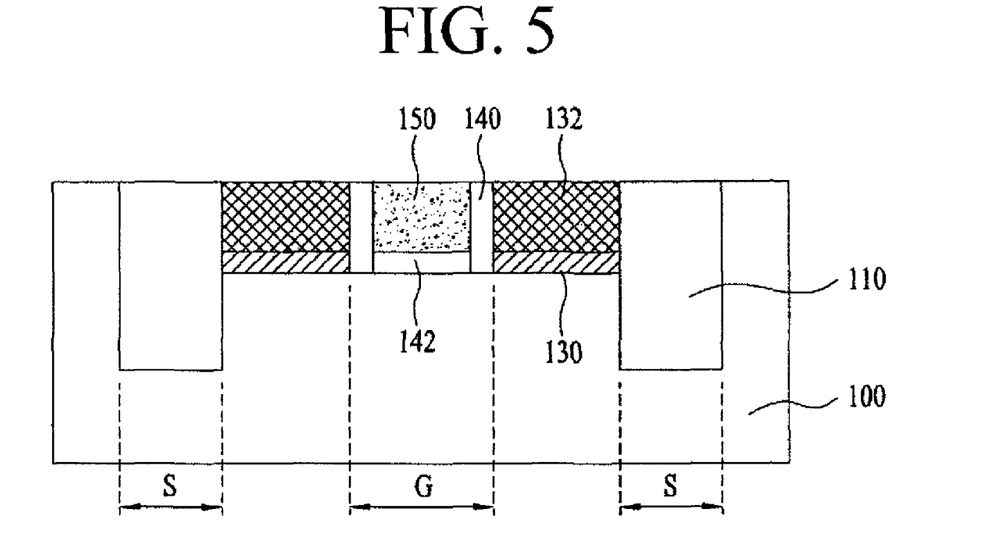
FIG. 5 is a cross-sectional view illustrating a semiconductor device in accordance with embodiments.

Example FIG. 5 illustrates a cross-sectional view showing a semiconductor device in accordance with embodiments. As illustrated in example FIG. 5, the semiconductor device may include lower structure 100 having STI region S and gate region G, device isolation film 110 formed in the STI region and sidewall spacer 140 is formed on and/or over sidewalls of a trench formed in the gate region. Gate insulating film 142 may be formed at the lowermost surface of the trench in the gate region, and gate electrode having two regions 152 and 154 may be formed on and/or over gate insulating film 142 in the gate region. Junction region 132 may be formed between device isolation film 110 and gate electrode 152 and 154 and LDD region 130 may be formed below junction region 132.

Device isolation film 110 and gate electrode 152 and gate electrode 154 may be formed having uppermost surfaces that are coplanar. The width of LDD region 130 may be formed to be exactly equal to the width of the gate region. The STI region and the gate region may be defined as a depressed portion in which a portion of lower structure 100 is removed. The STI region may be formed to have a depth larger than a depth of the gate region. Lower structure 100 may be, for example, a silicon substrate, but is not limited thereto. In the following description it should be understood that the substrate is lower structure 100. Device isolation film 110 is formed of an insulating film such as, but not limited to, a silicon nitride film or a silicon oxide film. Sidewall spacer 140 may be formed of a silicon nitride film. Gate insulating film 142 may be formed of a silicon oxide film. Gate insulating film 142 may serve to insulate gate electrode 152 and 154 from lower structure 100. Gate electrode 152 and 154 may be formed of a conductive material, for example, one of a polysilicon or a metal layer.

As described above, the semiconductor device in accordance with embodiments provides a structure preventing the lower portion of gate electrode 152 and 154 and LDD region 130 from overlapping each other.

Figure 6:
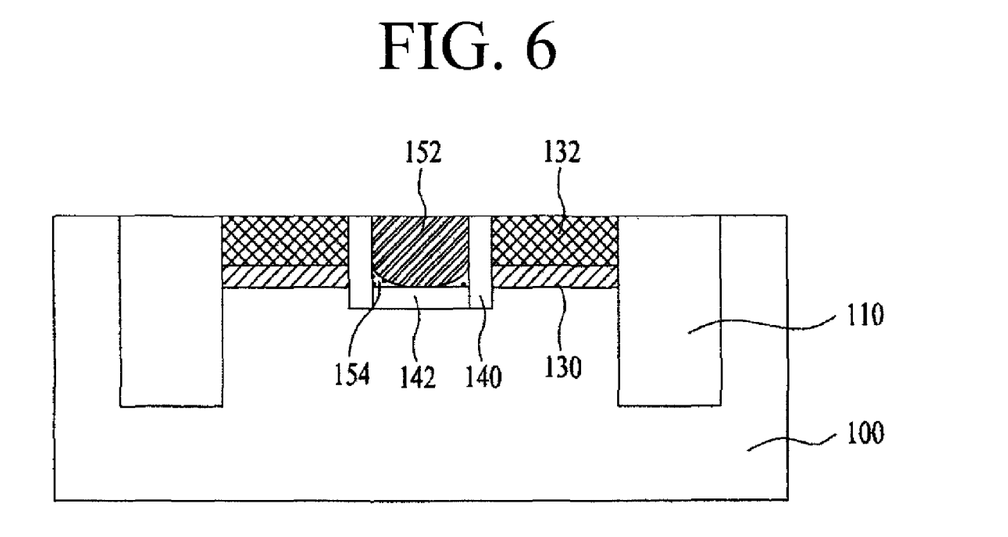
FIG. 6 is a cross-sectional view illustrating a semiconductor device in accordance with embodiments.

Example FIG. 6 illustrates a cross-sectional view showing a semiconductor device in accordance with embodiments. As illustrated in example FIG. 6, the semiconductor device may include lower structure 100 having STI region S and gate region G, device isolation film 110 formed in the STI region, sidewall spacer 140 formed on and/or over sidewalls of a trench formed in the gate region, and gate insulating film 142 formed on and/or over the lowermost surface of the trench in the gate region. The semiconductor device may also include gate electrode 152 and 154 having an uppermost surface that is coplanar with that of device isolation film 110 formed on and/or over gate insulating film 142 in the gate region, junction region 132 formed between device isolation film 110 and gate electrode 152 and 154, and LDD region 130 formed below junction region 132.

Gate electrode 152 and 154 may be formed of polysilicon or a metal and may include first region 154 and second region 152 having different impurity ion densities. First region 154 may be positioned at opposite ends of the lowermost portion of the gate electrode and has a first impurity ion density. Second region 152 is a remaining region in the gate electrode outside of first region 154 and may have an impurity ion density larger than the first impurity ion density.

As described above, the semiconductor device in accordance with embodiments provides a structure which prevents the lower portion of gate electrode 152 and 154 and LDD region 130 from overlapping each other. The field may be minimized at the opposite ends of the lower portion of the gate electrode when the gate electrode is formed of polysilicon. Accordingly, embodiments may provide an effect of maximizing gate-induced drain leakage (GIDL) characteristics. In accordance with embodiments, since the STI region and the gate region are formed at the same time, it may be possible to achieve desirable device characteristics and ensure a process margin by varying a gate profile. Embodiments may be applied to micro-processing of a nano gate line width providing an effect of realizing a gate electrode formed of a metal layer. Further, the STI region and the gate region may be formed at the same time. The device isolation film may be formed in the STI region, and the sacrificial layer may be formed in the gate region. The LDD region may then be formed while the device isolation film and the sacrificial layer are used as a barrier. Accordingly, the device may provide a structure capable of preventing the LDD region and the gate electrode from overlapping each other. Further, it may be possible to adjust an impurity ion density in the gate electrode, thereby efficiently preventing the LDD region and the gate electrode from overlapping each other. Accordingly, it is possible to achieve desirable GIDL characteristics. Embodiments also provide an effect of maximizing the characteristics of a non-salicide poly resistor having a resistance value of the gate. Since there is no height difference between the gate and active regions, additional etching stop layer may not be formed in processes including a M1C RIE process. This may provide an effect of simplifying the process.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   providing a lower structure having a shallow trench isolation regions (STI) and a gate region; and then
   forming a device isolation film in the STI regions and a sacrificial layer in the gate region; and then
   forming a lightly doped drain (LDD) region between the device isolation film and the sacrificial layer using the device isolation film and the sacrificial layer as barriers; and then
   forming a trench in the lower structure by selectively removing the sacrificial layer from the gate region; and then
   forming spacers on respective sidewalls of the trench; and then
   forming a gate insulating film on the lowermost surface of the trench and between the spacers; and then
   forming a gate electrode over the gate insulating film and filling the trench; and then
   forming a junction region in the lower structure and over the LDD region; and then
   diffusing the LDD region to opposite ends of the lower portion of the gate region.

2. The method of claim 1, wherein the device isolation film and the sacrificial layer are formed at the same time.

3. The method of claim 1, wherein forming the gate electrode comprises:
   filling a conductive material layer in the gate region; and then
   performing a chemical mechanical polishing (CMP) process using the spacers as stop layers.

4. The method of claim 3, wherein a polysilicon layer is formed as the conductive material layer in the gate region.

5. The method of claim 1, wherein forming the gate electrode comprises:
   filling a conductive material layer in the gate region; and then
   injecting ions into the conductive material layer at a first dosage in a first direction inclined at a first inclination angle with respect to a normal direction of the lower structure; and then
   injecting ions into the conductive material layer at a second dosage in a second direction opposite to the first direction and inclined at a second inclination angle with respect to the normal direction of the lower structure; and then
   injecting ions into the conductive material layer at a third dosage in a perpendicular direction relative to uppermost surface of the lower structure.

6. The method of claim 5, wherein the third dosage is larger than the first dosage and the second dosage.

7. The method of claim 5, wherein the first inclination angle has a range from approximately 0° to 45°.

8. The method of claim 5, wherein the second inclination angle has a range from approximately 0° to 45°.

9. The method of claim 1, wherein a metal layer is formed as the conductive material layer in the gate region.

10. A method comprising:
    forming a shallow trench isolation film in a substrate; and then
    forming a lightly doped drain region in the substrate adjacent to the shallow trench isolation film; and then
    forming a trench in a gate region of the substrate; and then
    simultaneously forming a junction region in the substrate and over the lightly doped drain region and a gate electrode by forming a gate electrode material layer in the trench and then sequentially performing on the gate electrode material layer a first ion implantation process at a first inclination direction and a first inclination angle with respect to a normal direction of the gate electrode material layer, a second ion implantation process at a second inclination direction opposite to the first inclination direction and a second inclination angle with respect to the gate electrode material layer, and a third ion implantation process at a third inclination angle with respect to a normal direction of the gate electrode material layer.

11. The method of claim 10, wherein the first inclination angle and the second inclination angle have a range from approximately 0° to 45° and the third inclination angle direction is approximately 90°.

12. The method of claim 10, wherein forming the gate electrode comprises forming the gate electrode material layer such that the uppermost surface of the gate electrode material layer is coplanar with the uppermost surface of the shallow trench isolation film.

13. The method of claim 10, wherein the gate electrode comprises a first gate electrode region having a first impurity ion density and a second gate electrode region having a second impurity ion density larger than the first impurity ion density.

14. The method of claim 10, further comprising, after forming the trench and before simultaneously forming the junction region and the gate electrode:

forming spacers on sidewalls of the trench; and then forming a gate insulating film on the lowermost surface of the trench, wherein eh gate electrode is formed over the gate insulating film.

* * * * *